(12) United States Patent
Baltz et al.

(10) Patent No.: US 11,581,164 B2
(45) Date of Patent: Feb. 14, 2023

(54) METAL PLATING OF GRIDS FOR ION BEAM SPUTTERING

(71) Applicant: Excelitas Technologies Corp., Waltham, MA (US)

(72) Inventors: Eric Baltz, Boulder, CO (US); Sam Richman, Boulder, CO (US); Nelson C. Turner, III, Longmont, CO (US)

(73) Assignee: Excelitas Technologies Corp., Waltham, MA (US)

( * ) Notice: Subject to any disclaimer, the term of this patent is extended or adjusted under 35 U.S.C. 154(b) by 384 days.

(21) Appl. No.: 16/498,601

(22) PCT Filed: Mar. 29, 2018

(86) PCT No.: PCT/US2018/025186
§ 371 (c)(1),
(2) Date: Sep. 27, 2019

(87) PCT Pub. No.: WO2018/183707
PCT Pub. Date: Oct. 4, 2018

(65) Prior Publication Data
US 2020/0051783 A1   Feb. 13, 2020

Related U.S. Application Data

(60) Provisional application No. 62/478,344, filed on Mar. 29, 2017.

(51) Int. Cl.
*H01J 37/317* (2006.01)
*C23C 14/46* (2006.01)
(Continued)

(52) U.S. Cl.
CPC .......... *H01J 37/3178* (2013.01); *C23C 14/46* (2013.01); *H01J 37/08* (2013.01);
(Continued)

(58) Field of Classification Search
None
See application file for complete search history.

(56) References Cited

U.S. PATENT DOCUMENTS 4,578,589 A * 3/1986 Aitken ............... H01J 37/3171
250/281
4,898,557 A   2/1990 Engemann
(Continued)

FOREIGN PATENT DOCUMENTS

GB   2 299 137 A   9/1996
JP   2003139044   5/2003

OTHER PUBLICATIONS

Macleod, "Recent developments in deposition techniques for optical thin films and coatings", Elsevier Science & Technology, 2013, ProQuest Ebook Central 2013.
(Continued)

*Primary Examiner* — Jason Berman
(74) *Attorney, Agent, or Firm* — Wolf, Greenfield & Sacks, P.C.

(57) ABSTRACT

Provided herein are deposition systems utilizing coated grids in an ion deposition process which provide more predictable erosion of the coating rather than erosion of the grid itself. Further, coatings may be utilized in which the coating material does not act as a contaminant to the deposition process, thereby eliminating contamination of the sample surface due to deposition of unwanted grid material. Also provided are methods of refurbishing a coated grid by periodically replacing the coating material thus protecting the grid itself and allowing a grid to be used indefinitely.

25 Claims, 9 Drawing Sheets

(51) Int. Cl.
*H01J 37/08* (2006.01)
*H01J 37/30* (2006.01)

(52) U.S. Cl.
CPC ..... *H01J 37/3007* (2013.01); *H01J 2237/081* (2013.01); *H01J 2237/3146* (2013.01)

(56) References Cited

U.S. PATENT DOCUMENTS

| | | | | |
|---|---|---|---|---|
| 4,931,158 | A * | 6/1990 | Bunshah | C23C 14/0068 |
| | | | | 204/192.12 |
| 4,963,239 | A * | 10/1990 | Shimamura | C23C 14/34 |
| | | | | 204/192.12 |
| 5,041,302 | A | 8/1991 | Kolde | |
| 5,811,820 | A | 9/1998 | Kirchner et al. | |
| 6,590,324 | B1 * | 7/2003 | Kanarov | H01J 27/022 |
| | | | | 313/299 |
| 2005/0211547 | A1 * | 9/2005 | Hanawa | C23C 14/358 |
| | | | | 204/192.12 |
| 2006/0017011 | A1 | 1/2006 | Shang | |
| 2014/0251790 | A1 * | 9/2014 | Kodaira | H01J 37/305 |
| | | | | 204/192.34 |
| 2016/0056016 | A1 | 2/2016 | Yasumatsu et al. | |

OTHER PUBLICATIONS

International Search Report and Written Opinion for International Application No. PCT/US2018/025186 dated Aug. 3, 2018.
International Preliminary Report on Patentability for International Application No. PCT/US2018/025186 dated Oct. 1, 2019.
Examination Report for British Application No. 1914159.7 dated Aug. 25, 2021.
PCT/US2018/025186, Aug. 3, 2018, International Search Report and Written Opinion.
PCT/US2018/025186, Oct. 1, 2019, International Preliminary Report on Patentability.
GB 1914159.7, Aug. 25, 2021, Examination Report.

* cited by examiner

METAL PLATING OF GRIDS FOR ION BEAM SPUTTERING

CROSS-REFERENCE TO RELATED APPLICATIONS

This application claims the benefit of and priority to US Provisional Application No. 62/478,344, filed Mar. 29, 2017, which is hereby incorporated in its entirety to the extent not inconsistent herewith.

BACKGROUND OF INVENTION

Ion Beam Sputtering, or IBS, is used in a variety of industries to deposit thin films of materials on a sample surface with controlled parameters (e.g. deposition thickness, structure, etc.). IBS uses an accelerated ion beam to dislodge particles from a target material, depositing the sputterant onto a sample. Typically, the ions are accelerated using a biased set of grids that electrostatically interact with a plasma to produce a beam directed at the target material. The grids used in these processes are typically made from a metal or carbon material (e.g. molybdenum, titanium, graphite, etc.).

While grid manufacturers strive to avoid interaction between the plasma and/or ion beam and the grids themselves, some interaction inevitably occurs in the form of either charge exchange or double ionization. Both interactions result in grid barrel erosion, which is the enlargement of grid barrel diameter. This enlargement causes two distinct problems in an IBS process. First, as the barrel diameter increases, the plasma beam's dimensions are altered and beam targeting is affected. Second, as the grid material itself is removed from the barrel due to interactions with the plasma or ions, the grid material can become a contaminant by acting as an unwanted secondary sputterant that is deposited onto either the target or sample surfaces.

For these and other reasons, grids are a problematic component in IBS systems, especially in applications in which grid contamination is a concern. Further, it can be difficult to determine when the above-mentioned problems are sufficient to necessitate replacement of the grid.

It can be seen from the foregoing that there remains a need in the art for grid systems for use with IBS or other deposition techniques with coatings which provide more predicable erosion due to beam interactions with the grid as well as reduced contamination via deposition of grid material on the sample surface. Further, there is a need for grid coatings that allow for the periodic replacement of the coating thereby providing continued protection of the valuable grid material.

SUMMARY OF THE INVENTION

Provided herein are deposition systems utilizing coated grids in an ion deposition process which provide more predictable erosion of the coating rather than erosion of the grid itself. Further, coatings may be utilized in which the coating material does not act as a contaminant to the deposition process, thereby eliminating contamination of the target and/or sample surface due to deposition of unwanted grid material. Also provided are methods of refurbishing a coated grid by periodically replacing the coating material thus protecting the grid itself and allowing a grid to be used indefinitely.

The provided systems and methods may be customized for a variety of specific applications. For example, a coating may match the desired sputterant, such that any coating material removed during the process acts as further sputterant rather than contamination. Alternately, coatings of a different material that does not act as a contaminant for the desired application may also be used. Advantageously, the coatings may be easily stripped and/or changed for specific applications or materials. Further, the provided coatings do not interact with the performance of the electromagnetic performance of the grid, and alternate grid geometries may be employed so that the physical dimensions of the coated grid resemble those of a conventional, uncoated grid.

In an aspect, provided is a deposition system comprising: i) an ion source suitable for providing a beam of selected ions, the ion source comprising at least one coated grid, the coated grids comprising: a) an electrically conductive substrate comprising a plurality of apertures extending through a thickness direction of the substrate; and b) a coating covering an outer surface of the substrate, wherein the coating is formed of a metallic or semiconducting material; and ii) a deposition chamber receiving the beam of selected ions when emitted from the ion source. In an embodiment, for example, the deposition system comprises a plurality of coated grids.

In embodiments, for example, the substrate, for example a grid, comprises molybdenum, graphite, titanium or a titanium alloy. In an embodiment, at least a portion of the substrate possesses a mean radius of curvature selected from the range of ±10 cm to ±10 m, a mean radius of curvature selected from the range of ±1 cm to ±1 m, or optionally, a mean radius of curvature selected from the range of ±1 cm to ±10 m. In embodiments, a mean thickness of the substrate is selected from the range of 0.1 mm to 1 cm, selected from the range of 0.1 mm to 1 mm, or optionally, selected from the range of 1 mm to 1 cm. In an embodiment, the apertures are positioned in a selected pattern. In embodiments, the pattern is selected from one of square, triangular or hexagonal.

In embodiments, for example, a mean diameter of the apertures is selected from the range from 0.1 mm to 1 cm, or optionally, selected from the range of 0.1 mm to 10 cm. In some embodiments, a mean center-center distance between adjacent apertures is selected from the range of 0.1 mm to 1 cm, or optionally, selected from the range of 0.1 mm to 10 cm.

The provided systems and methods may use beneficial coatings which enhance properties of the target deposition layer, reduce contamination of the deposition or are inert in the desired application such that deposition of the coating does not affect the desired properties provided by the deposition layer. The coatings may provide electrostatic benefits to the underlying grid or provide minimal electrostatic interaction with the grid allowing for the grid to generate the desired ion interactions. Further, multiple coating layers may be applied to the grid for electromagnetic properties, specific physical characteristics (hardness, ion interaction resistance, adhesion, etc.) and/or contamination reduction or sputterant enhancement.

In embodiments, the coating is selected from the group consisting of: titanium, tantalum, hafnium, magnesium, aluminum, zirconium, niobium, and silicon. In an embodiment, for example, the coating is aluminum. In an embodiment, the coating is oxidizable. In an embodiment, the coating is not a dielectric.

In embodiments, wherein the coating is characterized by a mean thickness less than or equal to 100 μm, less than or equal to 50 μm, or optionally, less than or equal to 10 μm. In embodiments, the coating is characterized by a mean thickness selected from the range of 10 μm to 100 μm, selected from the range of 1 μm to 50 μm, or optionally, selected from the range of 50 μm to 100 μm.

In embodiments, the coating is a conformal coating. In an embodiment, for example, the coating covers substantially all surfaces of the substrate or all aperture surfaces. In an embodiment, for example, the coating covers substantially all externally facing surfaces of the substrate or all externally facing aperture surfaces. In an embodiment, the coating is characterized by an electrical conductivity greater than or equal to $1\times10^{-3}$ S/m at 20° C.

In embodiments, the coating is a removable coating. In an embodiment, for example, the coating is not a contaminant to a target in the deposition chamber. In an embodiment, the coated grid comprises a multilayer structure including an external layer and at least one interlayer provided between the external layer and a surface of the substrate. In an embodiment, for example, the interlayer comprises an adhesion layer.

In an embodiment, the ion source comprises: i) a discharge chamber comprising: a) a plurality of sidewalls defining the extent of the discharge chamber; and b) an opening in a selected sidewall; ii) an ion optics system including: a) a tubular housing extending from a first end to a second end; b) the at least one coated grid positioned within the tubular housing; wherein the first end of the tubular housing is attached to the selected sidewall of the discharge chamber such that a longitudinal axis of the tubular housing extends through the opening in the selected sidewall; iii) a gas source containing a selected ionizing gas in fluid communication with the discharge chamber; iv) a radio frequency (RF) source suitable for ionizing the selected ionizing gas to form a plasma within the discharge chamber; and v) an electrical power source suitable for establishing a positive or negative potential difference between a ground and the at least one coated grid and accelerating a plurality of ions from plasma present within the discharge chamber through respective apertures of the plurality of grids, thereby forming an ion beam emitted from the second end of the tubular housing. In an embodiment, the ionizing gas is selected from the group consisting of xenon, krypton, argon, neon or helium. In an embodiment, the ion source comprises a 3 focal point, 3 grid, 16 cm grid assembly.

In an embodiment, for example, the at least one coated grid comprises: i) a first grid positioned closer to the first end of the tubular housing than the second end of the tubular housing; and a second grid positioned adjacent the first grid and closer to the second end of the tubular housing than the first end of the tubular housing. In an embodiment, a spacing between opposing surfaces of the first grid and the coated grid is selected from the range of 0.1 mm to 1 cm, selected from the range of 1 mm to 2 cm, or optionally, selected from the range of 0.1 mm to 5 cm. In an embodiment, the electrical power source is suitable for establishing: i) a positive potential difference between the first coated grid and the ground selected from the range of 200 V to 2000 V; and ii) a negative potential difference between the second coated grid and the ground selected from the range from 20 V to 500 V. In an embodiment, for example, the electrical power source is suitable for establishing: i) a positive potential difference between the first coated grid and the ground selected from the range of 200 V to 1500 V; and ii) a negative potential difference between the second coated grid and the ground selected from the range from 20 V to 400 V.

In an embodiment, the provided system further comprises: i) a sputtering target positioned within a pathway of the ion beam within deposition chamber; ii) a sample positioned within the deposition chamber; and iii) a deposition gas source in fluid communication with the deposition chamber. In embodiments, the target is positioned within the trajectory of the ion beam.

In an embodiment, for example, the sputtering target is formed from the same material as the grid coating material. In an embodiment, the deposition gas is oxygen. In an embodiment, impingement of the emitted ion beam upon the sputtering target results in: ejection of a portion of the sputtering target material from the sputtering target; and deposition of the ejected sputtering target material on a free surface of the sample.

In an aspect, provided is a method of generating a thin film comprising: i) providing a deposition system comprising: a) an ion source comprising the at least one coated grid, the coated grid comprising: an electrically conductive substrate comprising a plurality of apertures extending through a thickness direction of the substrate; and a coating covering an outer surface of the substrate, wherein the coating is formed of a metallic or semiconducting material; b) a discharge chamber in fluid communication with a gas source; a deposition chamber for receiving an ion beam from the ion source; ii) generating a plasma in the discharge chamber by ionizing a gas from the gas source; iii) establishing a positive or negative potential difference between a ground and the at least one coated grid and accelerating ions from the plasma present within the discharge chamber through respective apertures of the plurality of grids, thereby forming said ion beam; iv) directing said ion beam at a target provided in the deposition chamber, thereby generating sputtered target material; and v) depositing at least a portion of the sputtered target material on a receiving surface of a substrate provided in the deposition chamber, thereby generating said thin film.

In an aspect, provided is a method of refurbishing an ion beam source comprising: i) providing a grid that has been exposed to ions within an ion source for a selected operating period, the grid comprising: a) an electrically conductive substrate comprising a plurality of apertures extending through a thickness direction of the substrate; and b) a first coating positioned at an outer surface of the substrate, wherein the first coating comprises a portion at least partially eroded by ions and wherein the first coating is formed of a metallic or semiconducting material; ii) removing the first coating from the electrically conductive substrate; and iii) depositing a second coating on the outer surface of the substrate, wherein the second coating is formed of a metallic or semiconducting material.

Without wishing to be bound by any particular theory, there may be discussion herein of beliefs or understandings of underlying principles relating to the devices and methods disclosed herein. It is recognized that regardless of the ultimate correctness of any mechanistic explanation or hypothesis, an embodiment of the invention can nonetheless be operative and useful.

BRIEF DESCRIPTION OF THE DRAWINGS

FIG. 2A-2B. provides an example of a grid for generating an ion beam used in a conventional IBS system.

FIG. 4A-4D illustrates the use of conventional, non-coated grids in comparison with coated grids.

DETAILED DESCRIPTION OF THE INVENTION

In general, the terms and phrases used herein have their art-recognized meaning, which can be found by reference to standard texts, journal references and contexts known to those skilled in the art. The following definitions are provided to clarify their specific use in the context of the invention.

"Grids" as used herein refers to an electrically conductive substrate that may be useful in IBS systems for influencing the trajectory of ions. Grid may refer to substrates that accelerate or decelerate ions or interact with ions in any electromagnetic fashion. Grids may be shaped to have curved surfaces including convex surfaces, concave surfaces or mixed geometries in which some surfaces are convex and others are concave. Grid may have one or more apertures or barrels to allow ions to pass through and electromagnetically interact with the grid. Useful materials for grids include but are not limited to metals, semiconductors, graphite, molybdenum, titanium and alloys (e.g. titanium alloys or molybdenum alloys).

"Coating" refers to an external material layer physically adjacent to a material with a substantially different composition or substantially different physical properties. For example, a coated grid may refer to a grid of one composition (e.g. molybdenum, graphite, etc.) with an external surface layer with a different composition. Useful coating materials for the described systems and methods include but are not limited to: aluminum, titanium, tantalum, hafnium, magnesium, zirconium, and silicon. A grid may be considered coated if a portion of its surface has a coating present, for example, 50%, 75% or optionally 90% of the surface area of the grid has a coating present. Coating may refer to layers of various thicknesses including a thickness greater than or equal to 1 µm, greater than or equal to 10 µm, or in some embodiments, selected from the range of 1 µm to 1 mm or selected from the range of 10 µm to 100 µm.

"Sputterant" refers to materials generated by the dislodging of material from a source and comprises particles such as atoms, molecules, ions, electrically charged particles, particles having no electric charge and any clusters, aggregates or combinations of these materials. Sputterant may refer to a material being dislodged by interactions with ions and transported to the surface of a substrate. Sputterant may refer to both wanted deposition materials (i.e. desired sputterant) and/or unwanted materials removed from interactions with system components such as electromagnetic grids utilized in a system (i.e. contaminants).

"Substantially all" refers to a condition in which a majority described property has been achieved. In embodiments, substantially all refers to a condition in which 90%, 95% or 99% of a described property has been achieved. For example, "substantially all external surfaces" may refer to a condition in which 90%, 95% or optionally, 99% of the exposed surfaces of a substrate have been coated as described herein.

"Part" and "substrate" are used synonymously in the present description and refer to elements, materials, surfaces, device components and devices undergoing deposition, for example, deposition of material in an IBS process.

"Operably connected" and "operably coupled" are used synonymously in the present description and refer to a configuration of two or more device elements such that they can be used in combination to achieve specific functions, operations, functional tasks or device capabilities/features in a particular device configuration. Operably connected device elements can be optically coupled, electronically coupled, electrically coupled, mechanically coupled and magnetically coupled or any combination of these. Operably connected device elements can be in one way communication, in two way communication or any combination of these device configurations. Operably coupled device elements is used in the present invention to provide devices and device configurations having a desired functionality, such as fabrication of spatially uniform thin films and devices comprising thin films having accurately selected physical and/or optical thicknesses, thickness profiles, chemical properties and optical characteristics.

Example 1

Metal Plating of Grids for Ion Beam Sputtering

The ion beam sputtering (IBS) process utilizes gridded ion sources to accelerate ions into a sputtering target. Molybdenum and graphite grids are commonly used in IBS systems to provide the sputtering ions used in the reactive and non-reactive production of dielectrics. It is understood that the process erodes both the accelerator and decelerator grids as a matter of course. Two published mechanisms which cause grid barrel erosion are charge exchange and double ionization [1]. As the grids wear, the grid material itself can end up contaminating the ion beam and act as an unwanted sputterant. In principle, grids may be fabricated from a variety of conductive materials. In practice, however, molybdenum has several advantages over most other materials: high melting point, low sputter yield, low CTE and high elastic modulus, as well as being ductile enough to form into curved surfaces for concave, convex and mixed shape ion optical elements.

Grid manufacturers take great care to minimize erosion. They do this by designing the grids with optimum hole sizes. But, because of charge exchange and double ionization, the erosion rate is commonly a non-zero value. As the grids wear, the hole or barrel sizes change, which in turn changes the field lines of the ion beamlets. This erosion affects the ion trajectories [2], which in turn may cause accelerated wear and erosion as the grids age.

Described herein are means to protect new or refurbish worn grids by coating (electroplating, CVD, EPD, IBS, e-beam, sputtering, etc.) grids (including molybdenum grids) with a layer of a metal or semiconductor that is normally part of the IBS deposition process. Because barrel erosion is a significant part of the wear of the grids, a conformal coating/plating process configured to coat the inside of the barrels as well as the surfaces is advantageous. Some useful materials for coating/plating include titanium, tantalum, hafnium, magnesium, aluminum, zirconium and silicon. A layer of coating, for example, 25 μm of aluminum, is expected to be sufficient to allow 250 hours of grid material-contamination (e.g. molybdenum) free coating.

An example of a coating cycle includes:
1. Coating grids with 10 μm to 100 μm of a material such as aluminum (Accelerator and Decelerator grids may be coated, or optionally, just the Decelerator grid)
2. Ream out screw and alignment holes to their nominal size
3. Reassemble the grids, possibly adjusting the spacing to compensate for the additional material provided by the coating
4. Use the coated grids in an IBS chamber for 150-500 hours
5. Remove and disassemble the grids
6. Strip off any oxide from the grids via a chemical or mechanical process (e.g. treating with an acid solution or bead-blasting)
7. Strip of coating material (e.g. aluminum). This may be accomplished by treating with a base with enough strength to remove coating without damaging the underlying grid or by bead-blasting the coating surface as the coating material may be softer than the grid material and may be selectively removed by adjusting the pressure.
8. Returning to Step 1

As long as the base grid material (e.g. molybdenum) is not damaged and does not wear, this procedure may be repeated indefinitely. A grid-set treated in this manner will not age in the conventional sense over many refurbishment cycles and the hole sizes remain the precise dimensions even after a large number of refurbishment cycles (e.g. 10 or 20 cycles).

FIG. 4 illustrates the differences in utilizing a conventional grid in comparison to a coated grid as described herein. FIG. 4A shows a conventional new grid. The grid has a small amount of barrel wear on the accelerator grid (A) caused by ion exchange with a neutral gas. Note that the small amount of grid material may end up as a contaminant in the ion beam. FIG. 4B illustrates that after operating the grid for a period of time, the hole sizes are no longer optimal. This increases the direct impingement of the decelerator grid (D). FIG. 4C provides grids treated with aluminum coating. Charge exchange still occurs, but the dislodged material is aluminum or another beneficial material as a sacrificial layer. FIG. 4D shows that after several refurbishment cycles the grid and hole sizes are essentially the same as those of a new grid.

EXPERIMENTAL RESULTS

Figure 1:
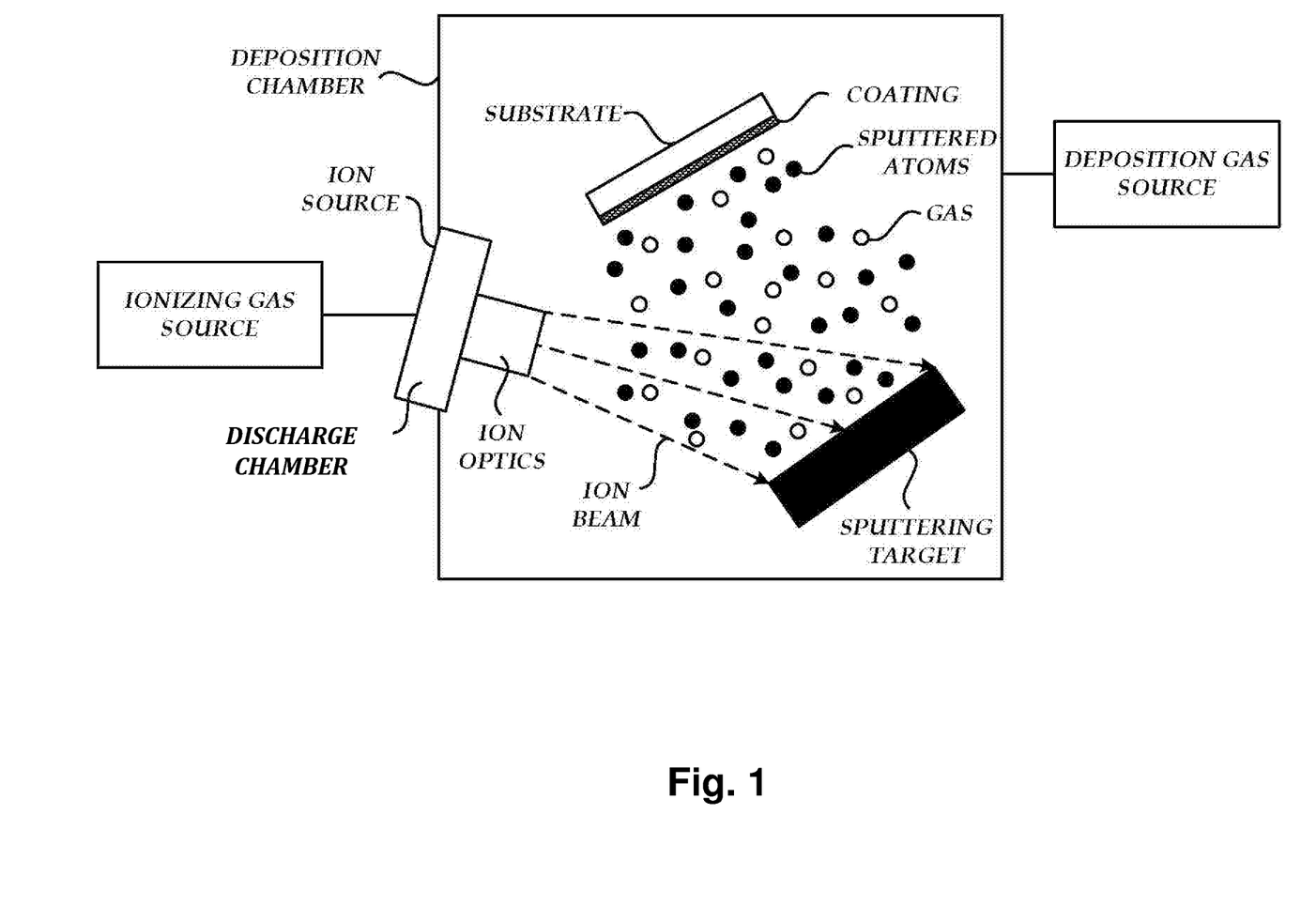
FIG. 1. provides an example of a conventional ion beam sputtering system.
Figure 2A:
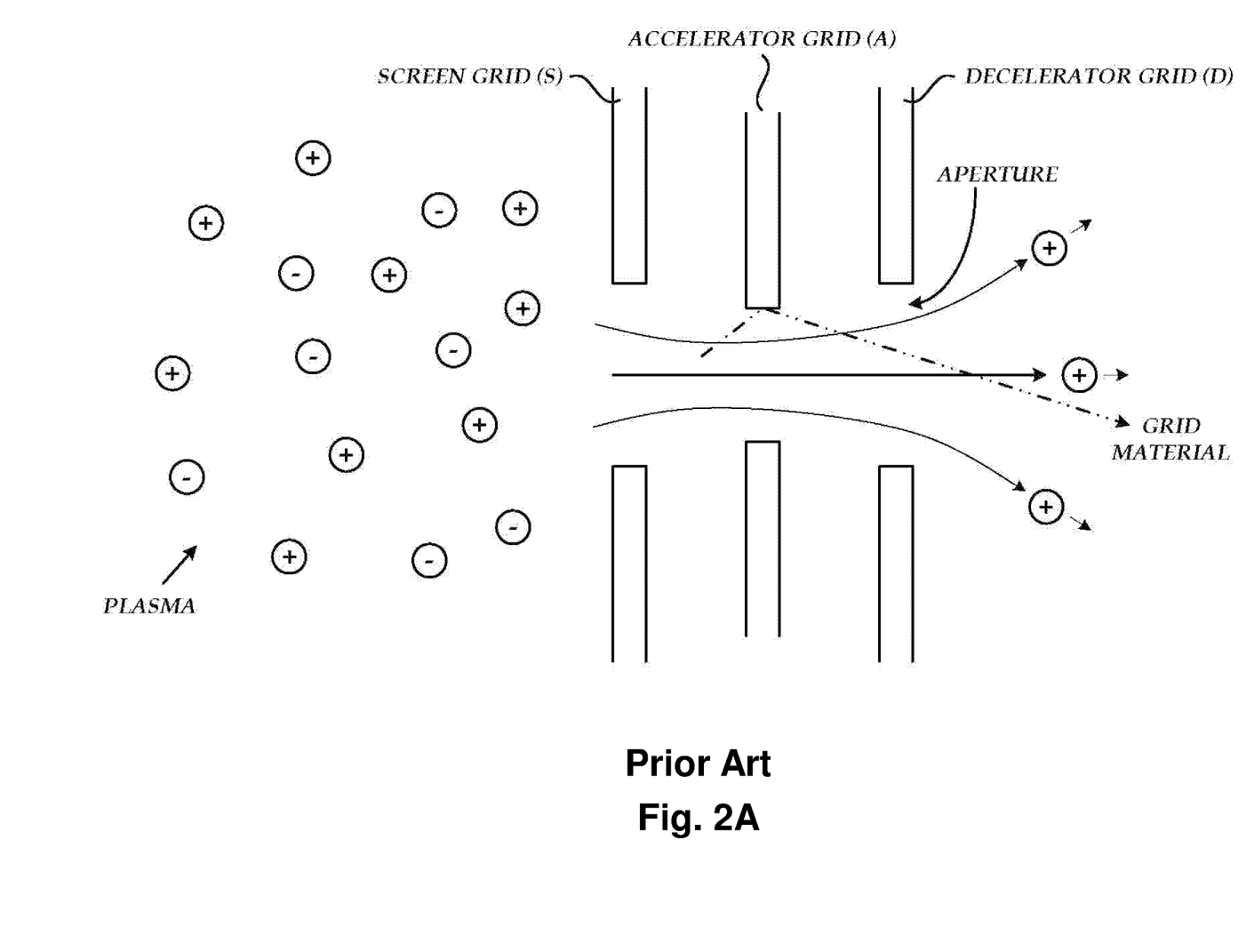
FIG. 2A shows a new non-coated grid in which the grid is relatively new. In contrast.
Figure 2B:
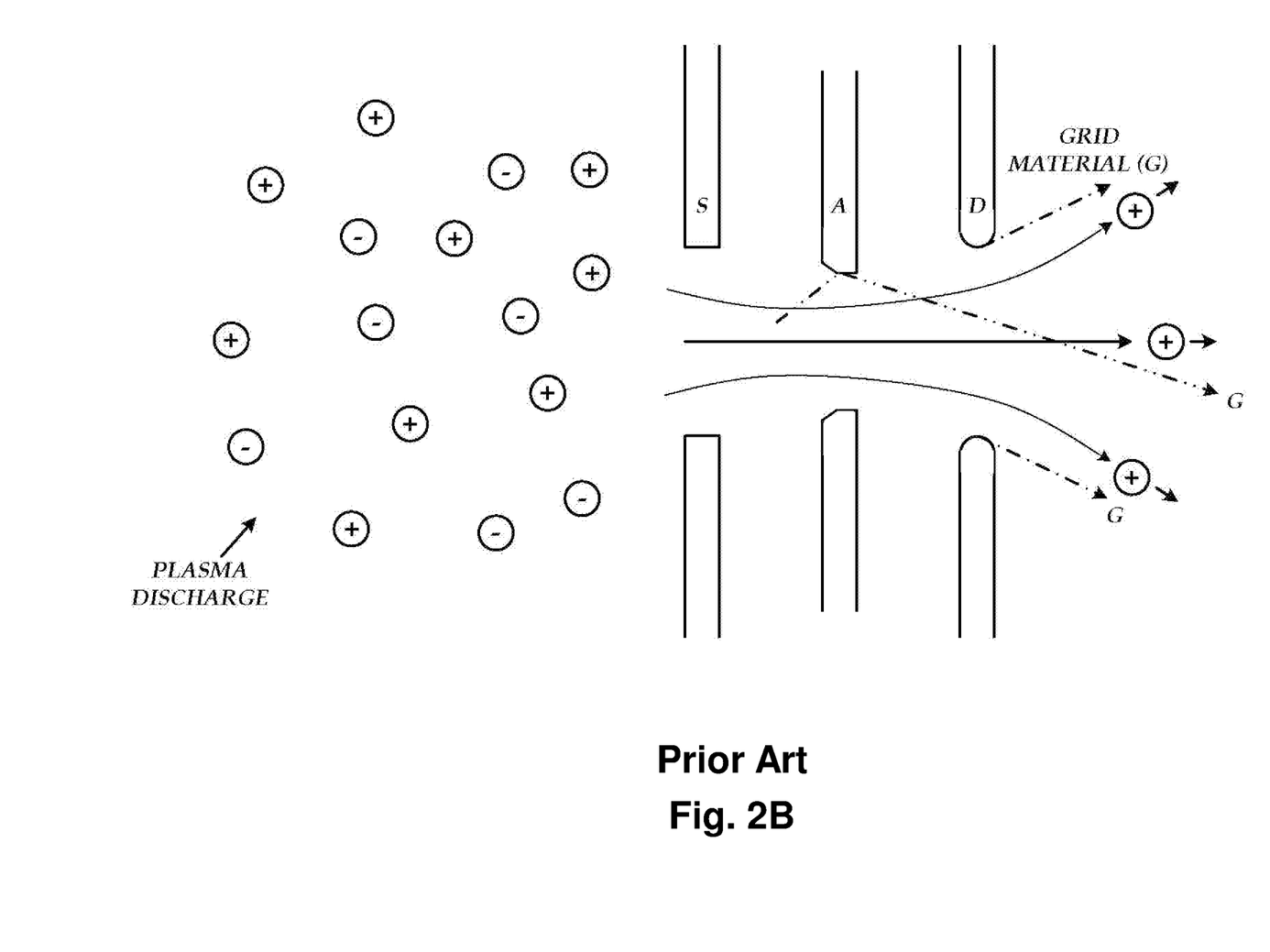
FIG. 2B shows a grid after some barrel erosion has occurred. Note that the accelerator grid (A) and decelerator grid (D) both show signs of barrel erosion and the barrel size has increased.
Figure 3:
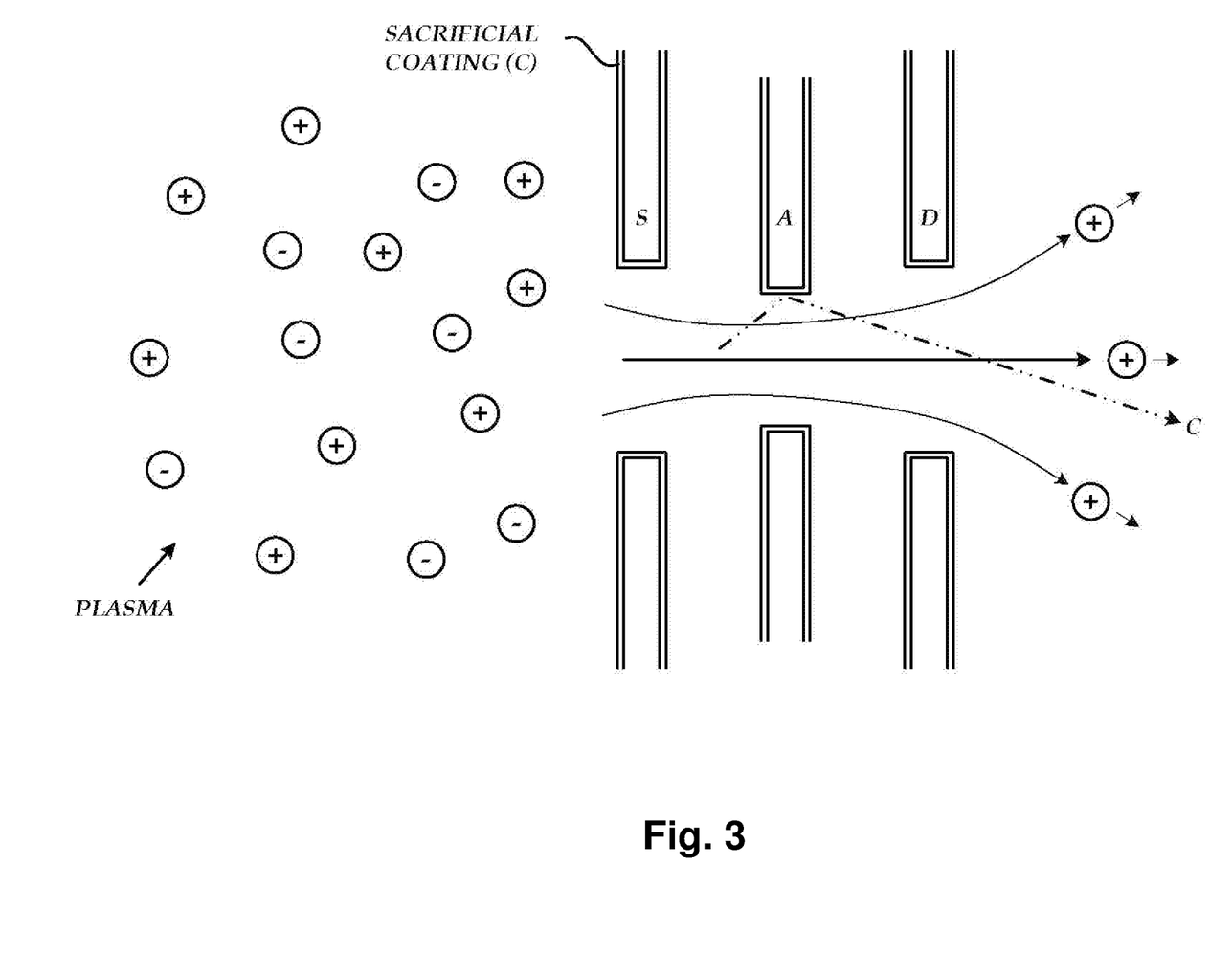
FIG. 3. provides an example of a coated grid. The underlying grid size remains unchanged over time, as only the coating is subject to barrel erosion.
Figure 4A:
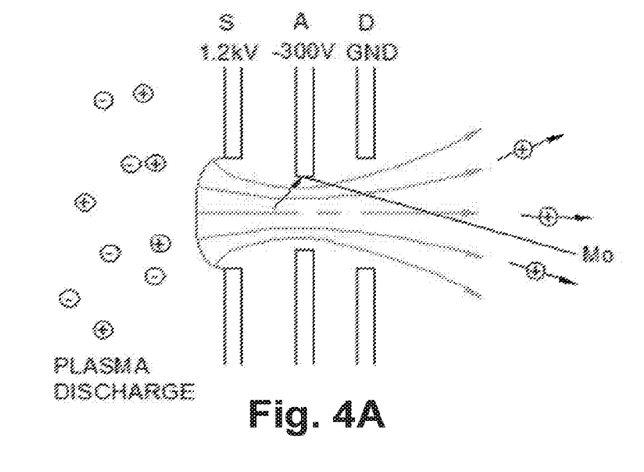
FIGS. 4A and 4B show a new conventional grid prior to barrel erosion occurring and a grid after a period of use in which the accelerator grid (A) and decelerator grid (D) show signs of wear, respectively.
Figure 4B:
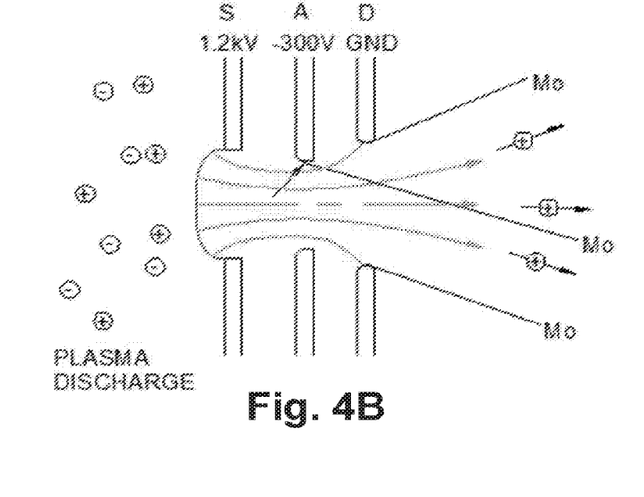
Figure 4C:
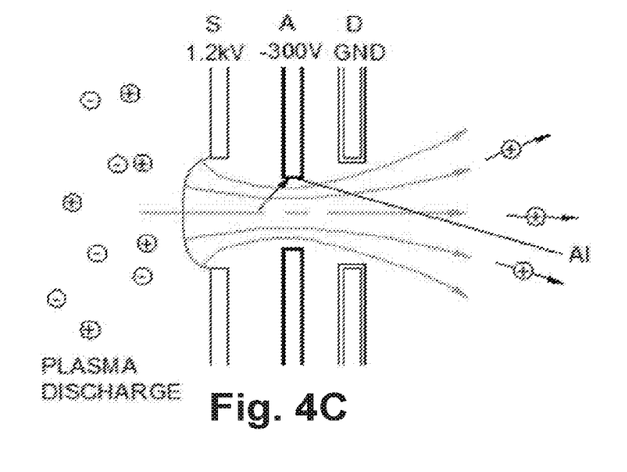
FIG. 4C provides an example of a coated grid prior to barrel erosion occurring.
Figure 4D:
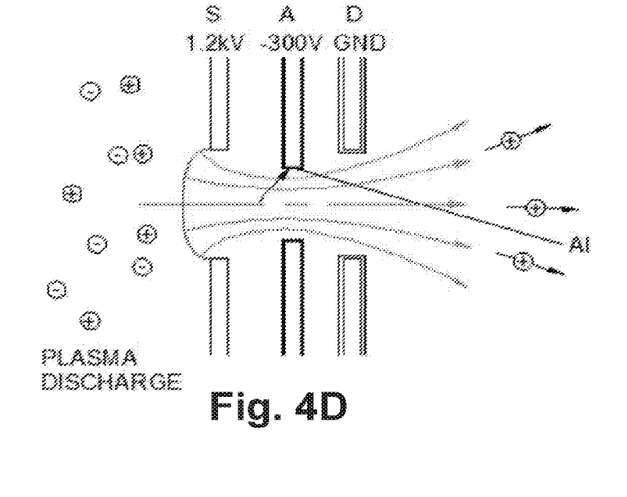
FIG. 4D provides an example of a coated grid after numerous refurbishment cycles and illustrates that the grid dimensions remain unchanged.
Figure 5:
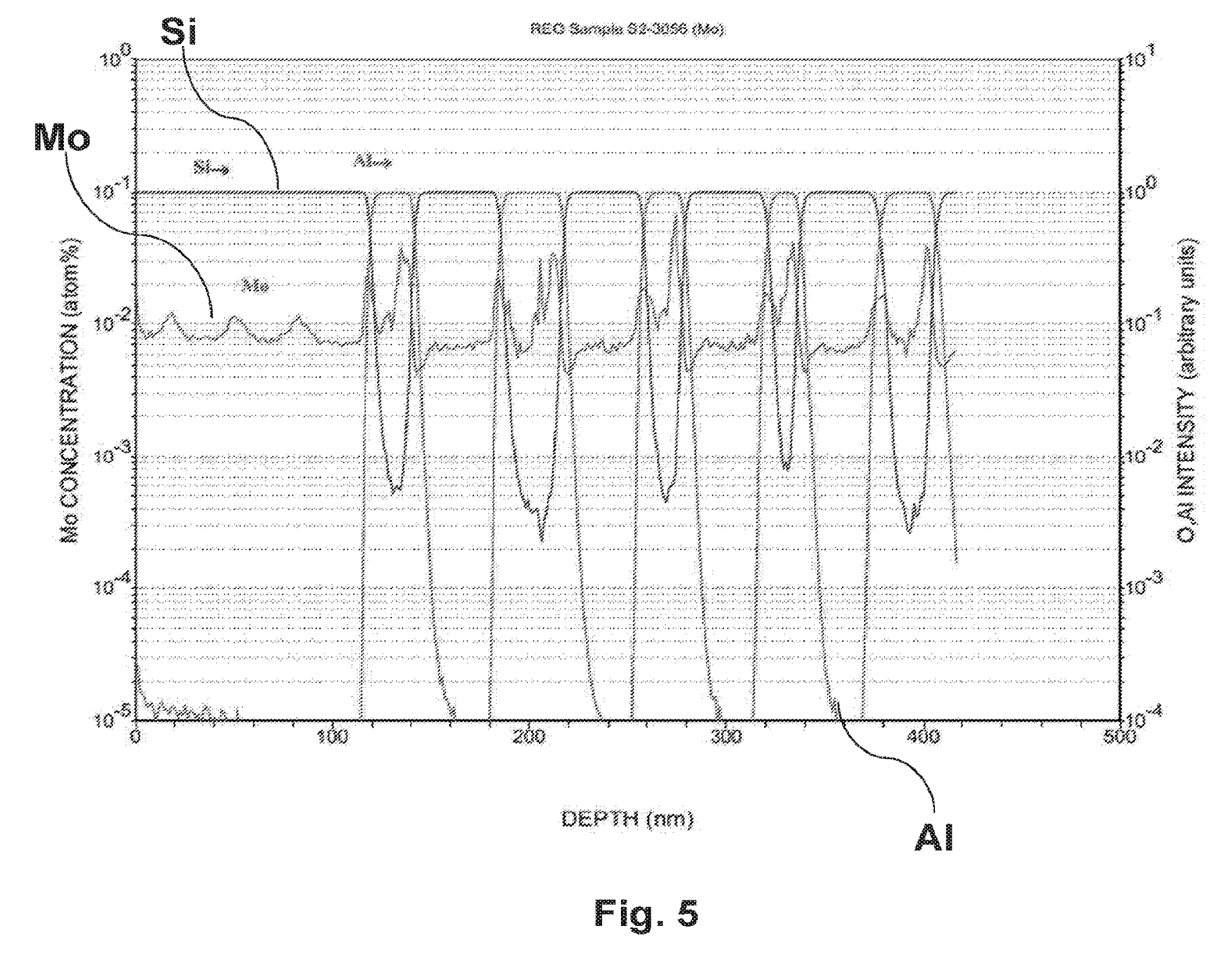
FIG. 5 is a secondary ion mass spectrometry (SIMS) analysis of a sample generated utilizing a conventional, non-coated molybdenum grid.
Figure 6:
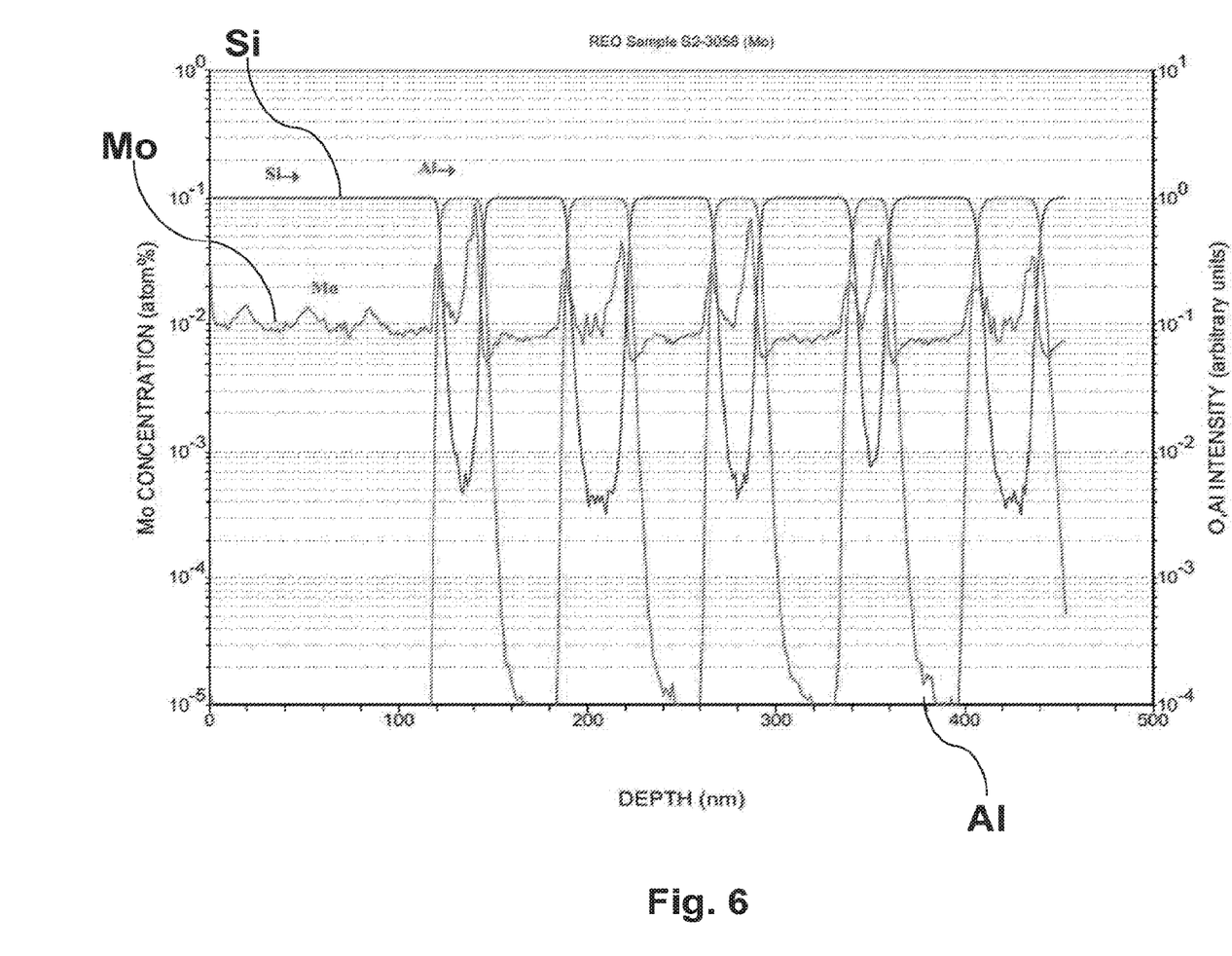
FIG. 6 is a SIMS analysis of a sample generated utilizing a conventional, non-coated molybdenum grid.

FIGS. 5 and 6 show molybdenum impurity profiles generated by SIMS analysis for two distinct samples in which no coating material was used on the grids, respectively. The molybdenum is plotted in units of atomic percent with respect to the left y-axis. Aluminum and silicon profiles are plotted in arbitrary units with respect to the right y-axis to mark the locations of $Al_2O_3$ and $SiO_2$ layers. Both of these samples show similar amounts of Mo impurity, presumably arising from sputtering of grids in the sputtering system used for depositing the coating layers. In addition, the thicker, top $SiO_2$ appears to have been deposited in four steps with increased Mo contamination between each step.

Figure 7:
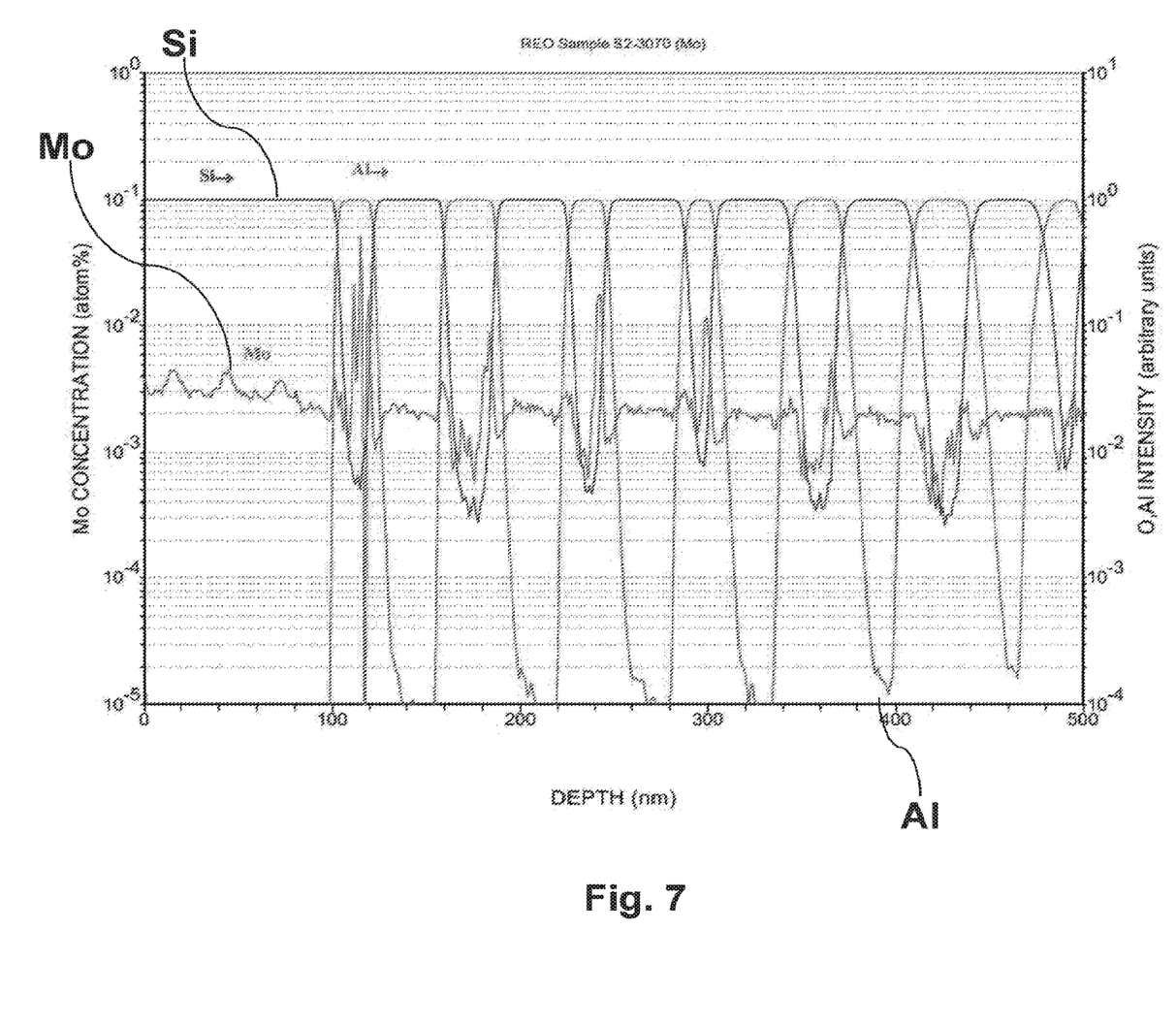
FIG. 7 is a SIMS analysis of a sample generated utilizing a molybdenum grid coated with an aluminum proactive layer.
Figure 8:
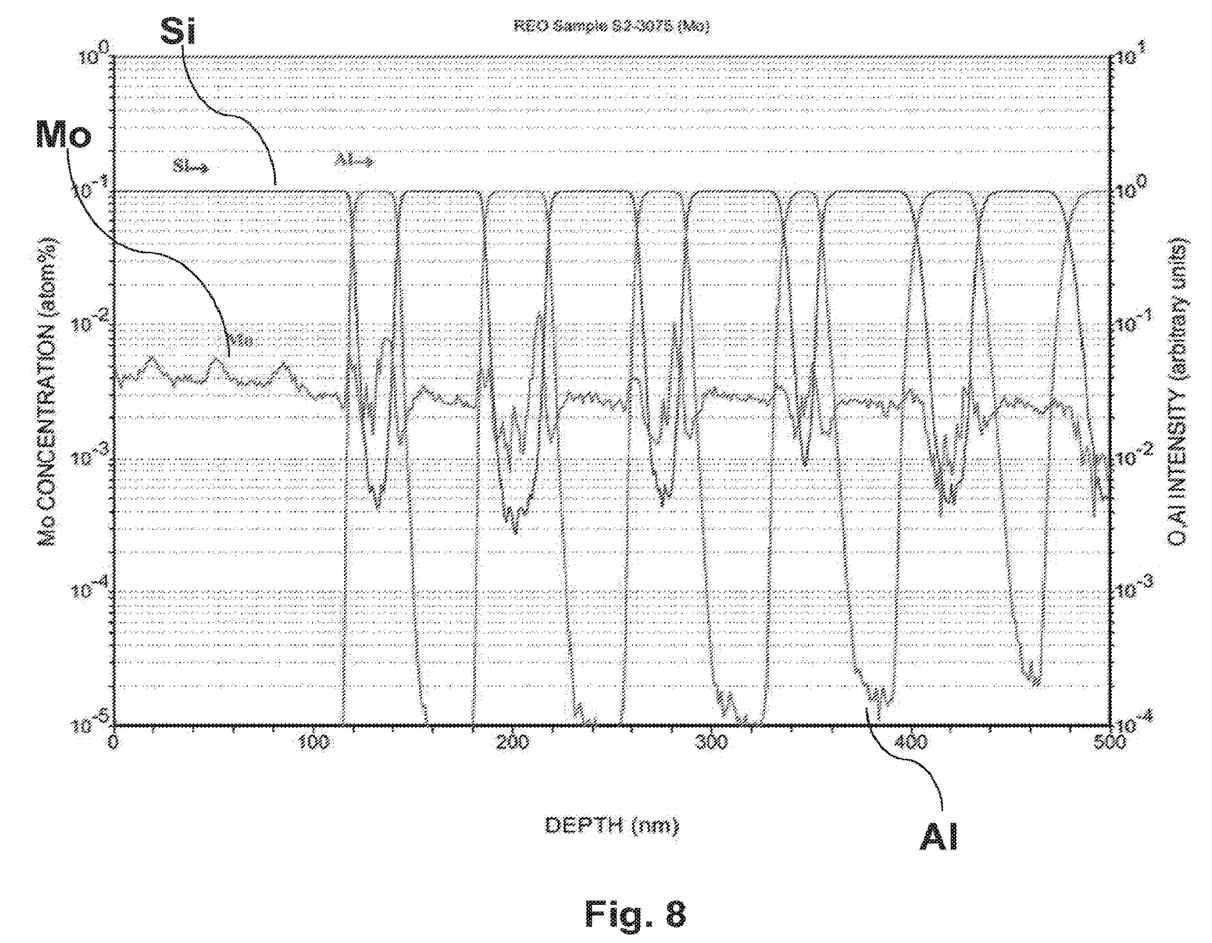
FIG. 8 is a SIMS analysis of a sample generated utilizing a molybdenum grid coated with an aluminum proactive layer.

FIGS. 7 and 8 show the molybdenum impurity profiles generated by SIMS analysis for two distinct samples in which the decelerator grid was coated with aluminum, respectively. Both of these samples also show similar amounts of molybdenum impurity with respect to each other, but at lower levels than for samples in which a coating was not used as seen in FIGS. 5 and 6. And as with the two non-coated samples, the coated samples show that the thicker, top $SiO_2$ also appears to have been deposited in four steps with increased molybdenum contamination between each step.

Note that the total depth of each analysis is correct. These depths were established by profilometry measurements of the sputtered craters. However, the plotted thicknesses of the individual layers are not correct due to a difference in the sputtering rate between the $Al_2O_3$ and $SiO_2$ layers. The $Al_2O_3$ layers are plotted too thick and the $SiO_2$ layers are plotted too thin.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, including any isomers or alloys of the group members, are disclosed separately. When a Markush group or other grouping is used herein, all individual members of the group and all combinations and subcombinations possible of the group are intended to be individually included in the disclosure. Specific names of compounds are intended to be exemplary, as it is known that one of ordinary skill in the art can name the same compounds differently.

Every formulation or combination of components described or exemplified herein can be used to practice the invention, unless otherwise stated.

Whenever a range is given in the specification, for example, a temperature range, a physical dimension range, an electric potential range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, coating methods, deposition methods, ion generation methods and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

REFERENCES

[1] *Fundamentals of Electric Propulsion, Ion and Hall Thrusters*, Goebel & Katz, pp. 234

[2] *Fundamentals of Electric Propulsion, Ion and Hall Thrusters*, Goebel & Katz, pp. 203

We claim:

1. A deposition system comprising:
   an ion source suitable for providing a beam of selected ions, the ion source comprising at least one coated grid, the at least one coated grid comprising: an electrically conductive substrate comprising a plurality of apertures extending through a thickness direction of the electrically conductive substrate; and a coating covering an outer surface of the electrically conductive substrate, wherein the coating is formed of a metallic or semiconducting material; and a deposition chamber receiving the beam of selected ions when emitted from the ion source, and wherein the at least one coated grid comprises a multilayer structure including an external layer and at least one interlayer provided between the external layer and a surface of the electrically conductive substrate.

2. The deposition system of claim 1, wherein the electrically conductive substrate comprises molybdenum, graphite, titanium or a titanium alloy.

3. The deposition system of claim 1, wherein at least a portion of the electrically conductive substrate has a mean radius of curvature selected from the range of ±10 cm to ±10 m.

4. The deposition system of claim 1, wherein a mean thickness of the at least one coated grid is selected from the range of 0.1 mm to 1 cm.

5. The deposition system of claim 1, wherein the plurality of apertures are positioned in a pattern selected from one of the group consisting of a square, a triangle or a hexagon, a mean diameter of the plurality of apertures is selected from the range from 0.1 mm to 1 cm, and a mean center-center distance between adjacent apertures is selected from the range of 0.1 mm to 1 cm.

6. The deposition system of claim 1, wherein the coating is selected from the group consisting of: titanium, tantalum, hafnium, magnesium, aluminum, zirconium, niobium, and silicon.

7. The deposition system of claim 1, wherein the coating is oxidizable.

8. The deposition system of claim 1, wherein the coating is not a dielectric.

9. The deposition system of claim 1, wherein the coating is characterized by a mean thickness less than or equal to 100μm.

10. The deposition system of claim 1, wherein the coating covers substantially all surfaces of the at least one coated grid.

11. The deposition system of claim 1, wherein the coating is characterized by an electrical conductivity greater than or equal to $1 \times 10^{-3}$ S/m at 20° C.

12. The deposition system of claim 1, wherein the coating is a removable coating.

13. The deposition system of claim 1, wherein the at least one interlayer comprises an adhesion layer.

14. The deposition system of claim 1, wherein the ion source comprises:
   a discharge chamber comprising:
      a plurality of sidewalls defining an extent of the discharge chamber; and
      an opening in a selected sidewall;
   an ion optics system including:
      a tubular housing extending from a first end to a second end;

the at least one coated grid positioned within the tubular housing;

wherein the first end of the tubular housing is attached to the selected sidewall of the discharge chamber such that a longitudinal axis of the tubular housing extends through the opening in the selected sidewall; a gas source containing a selected ionizing gas in fluid communication with the discharge chamber;

a radio frequency (RF) source suitable for ionizing the selected ionizing gas to form a plasma within the discharge chamber; and an electrical power source suitable for establishing a positive or negative potential difference between a ground and the at least one coated grid and accelerating a plurality of ions from plasma present within the discharge chamber through respective apertures of the at least one coated grid, thereby forming an ion beam emitted from the second end of the tubular housing.

15. The deposition system of claim 14, wherein the selected ionizing gas is selected from the group consisting of, xenon, krypton, argon, neon or helium.

16. The deposition system of claim 14, wherein the ion source comprises a 3 focal point, 3 grid, 16 cm grid assembly.

17. The deposition system of claim 14, wherein the at least one coated grid comprises:
a first coated grid positioned closer to the first end of the tubular housing than the second end of the tubular housing; and
a second coated grid positioned adjacent the first coated grid and closer to the second end of the tubular housing than the first end of the tubular housing.

18. The deposition system of claim 17, wherein a spacing between opposing surfaces of the first coated grid and the second coated grid is selected from the range of 0.1 mm to 5 cm.

19. The deposition system of claim 18, wherein the electrical power source is suitable for establishing:
a positive potential difference between the first coated grid and the ground selected from the range of 200 V to 2000 V; and
a negative potential difference between the second coated grid and the ground selected from the range from 20 V to 500 V.

20. The deposition system of claim 14, further comprising:
a sputtering target positioned within a pathway of the ion beam within deposition chamber;
a sample positioned within the deposition chamber; and
a deposition gas source in fluid communication with the deposition chamber.

21. The deposition system of claim 20, wherein the sputtering target is formed from the same material as that of the coating.

22. The deposition system of claim 20, wherein a deposition gas from the deposition gas source comprises oxygen.

23. A method of generating a thin film comprising:
providing a deposition system comprising:
an ion source comprising at least one coated grid, the at least one coated grid comprising:
an electrically conductive substrate comprising a plurality of apertures extending through a thickness direction of the electrically conductive substrate; and
a coating covering an outer surface of the electrically conductive substrate, wherein the coating is formed of a metallic or semiconducting material,
wherein the at least one coated grid comprises a multilayer structure including an external layer and at least one interlayer provided between the external layer and a surface of the electrically conductive substrate;
a discharge chamber in fluid communication with a gas source; and
a deposition chamber for receiving an ion beam from the ion source;
generating a plasma in the discharge chamber by ionizing a gas from the gas source;
establishing a positive or negative potential difference between a ground and the at least one coated grid and accelerating ions from the plasma present within the discharge chamber through respective apertures of the at least one coated grid, thereby forming said ion beam;
directing said ion beam at a target provided in the deposition chamber, thereby generating sputtered target material; and
depositing at least a portion of the sputtered target material on a receiving surface provided in the deposition chamber, thereby generating said thin film.

24. The method of claim 23, further comprising:
providing a sputtering target in the deposition chamber,
wherein the sputtering target is a same material as the coating covering the outer surface of the electrically conductive substrate.

25. The deposition system of claim 1, further comprising:
a sputtering target in a pathway of an ion beam within the deposition chamber,
wherein the sputtering target is a same material as the coating covering the outer surface of the electrically conductive substrate.

* * * * *